United States Patent
Tsunashima et al.

[19]

[11] Patent Number: 5,849,089
[45] Date of Patent: Dec. 15, 1998

[54] EVAPORATOR FOR LIQUID RAW MATERIAL AND EVAPORATION METHOD THEREFOR

[75] Inventors: Yoshitaka Tsunashima; Katsuya Okumura, both of Yokohama, Japan

[73] Assignee: Kabushiki Kaisha Toshiba, Kawasaki, Japan

[21] Appl. No.: 818,750

[22] Filed: Mar. 14, 1997

[51] Int. Cl.[6] .................................................. C23C 16/00
[52] U.S. Cl. .......................................... 118/726; 261/104
[58] Field of Search ............................. 118/726; 261/104

[56] References Cited

U.S. PATENT DOCUMENTS

| | | | |
|---|---|---|---|
| 568,928 | 10/1896 | Stratton et al. | |
| 3,129,268 | 4/1964 | Evett | 261/104 |
| 4,007,601 | 2/1977 | Webbon | 261/104 |
| 4,035,451 | 7/1977 | Tringali | 261/101 |
| 4,036,915 | 7/1977 | Lucero | 261/104 |
| 4,068,625 | 1/1978 | Brown | 261/104 |
| 4,146,597 | 3/1979 | Eckstein | 261/104 |
| 4,155,961 | 5/1979 | Benthin | 261/104 |
| 5,322,710 | 6/1994 | Visser | 427/248.1 |
| 5,372,754 | 12/1994 | Ono | 261/142 |

FOREIGN PATENT DOCUMENTS

250552-A   10/1987   Germany.

OTHER PUBLICATIONS

J. Priest and H.L. Caswell, Evaporation Source for Metals, IBM Disclosure Bulletin vol. 4, 12 May 1962, (p. 31. 19–20).

J.R. Howell, A.C. Key, D.C. Rudolph and P.P. Schirling, Evaporant Source IBM Disclosure Bulletin vol. 9, 12 May 1967.

Primary Examiner—Richard Bueker
Attorney, Agent, or Firm—Banner & Witcoff, Ltd.

[57] ABSTRACT

Inside a first cylinder for structuring an evaporator, a second cylinder is provided. The second cylinder has an undulated surface and a plurality of fine holes are provided on this surface. A liquid TEOS is contained in a first space positioned between the first cylinder and the second cylinder, and a second space positioned inside the second cylinder is filled with a gas TEOS evaporated from the fine holes. The pressure of the gas TEOS is set to be almost equal to the pressure of the liquid TEOS.

28 Claims, 5 Drawing Sheets

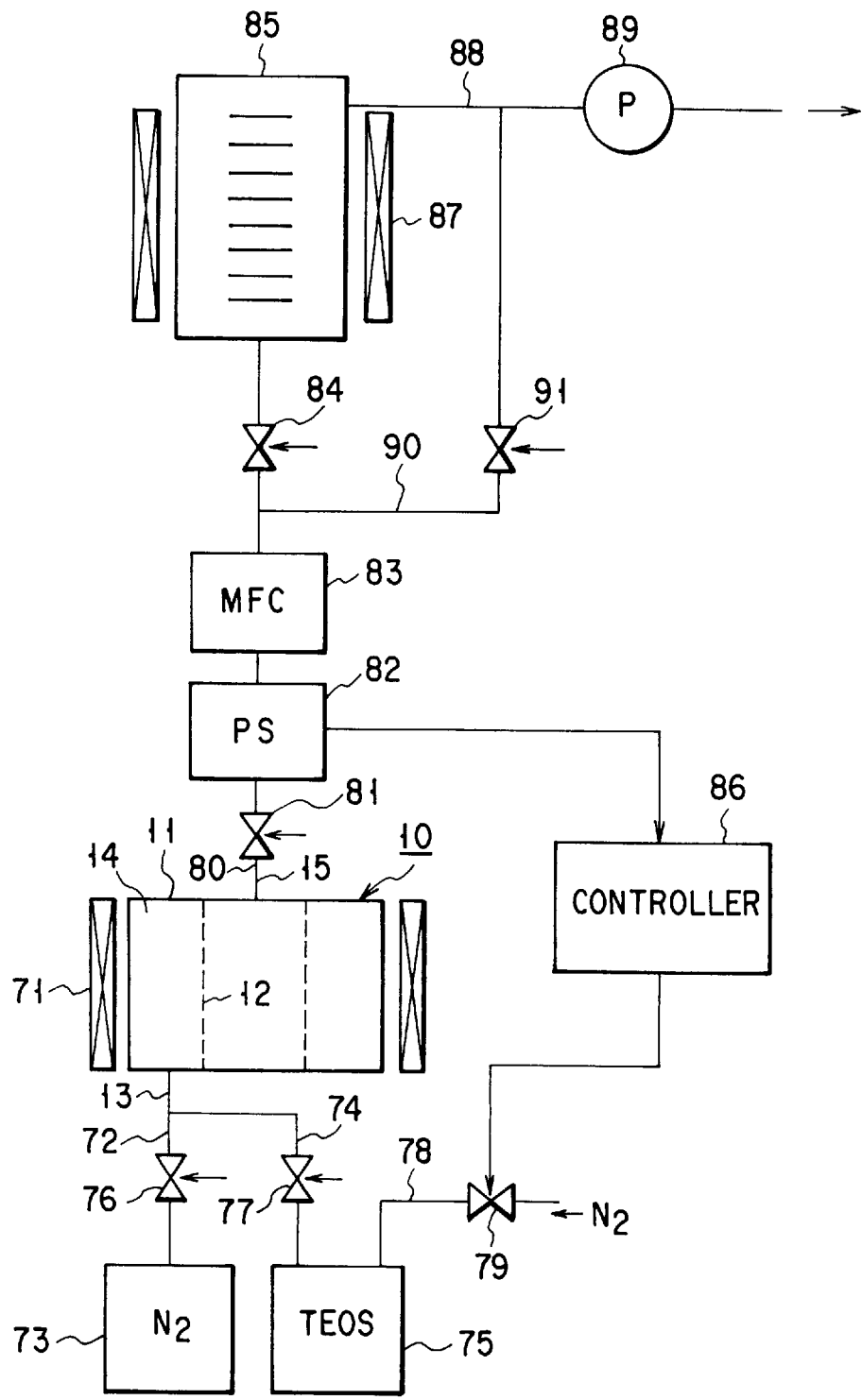
F I G. 7

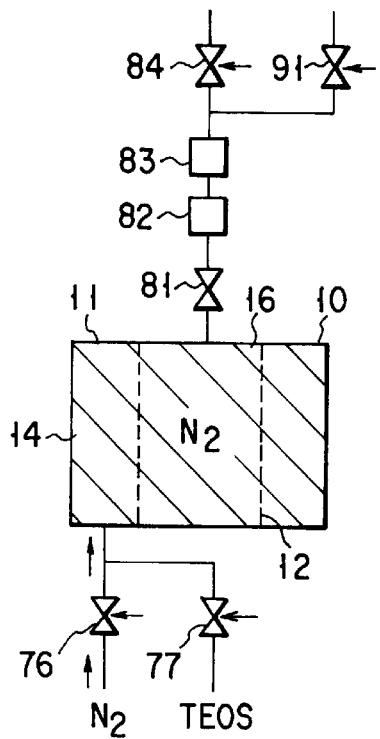
F I G. 8A
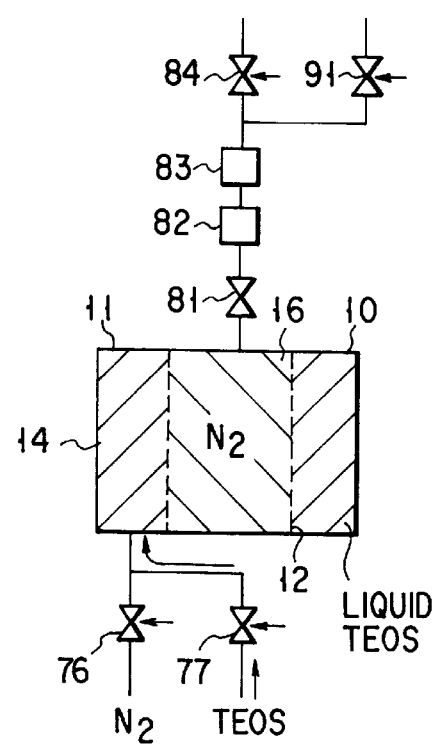
F I G. 8B
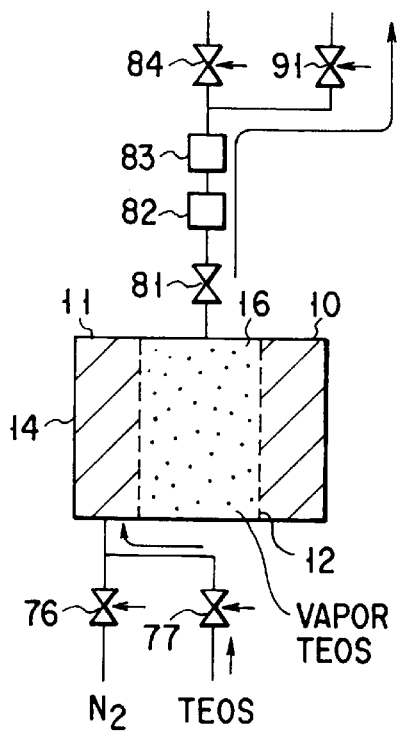
F I G. 8C
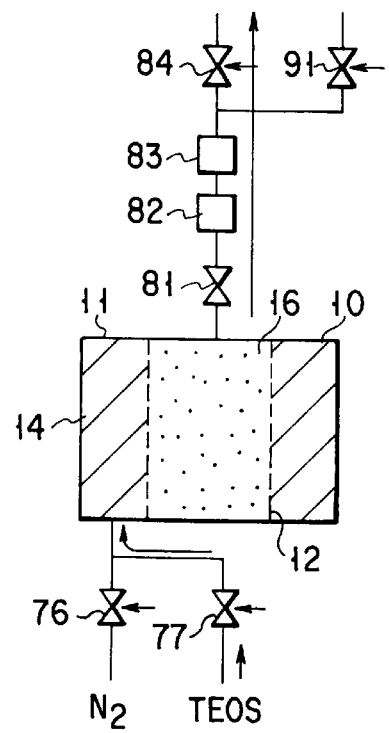
F I G. 8D

EVAPORATOR FOR LIQUID RAW MATERIAL AND EVAPORATION METHOD THEREFOR

BACKGROUND OF THE INVENTION

The present invention relates to a manufacturing of a semiconductor apparatus for carrying out formation of an oxide film using a gas as a raw material, for example, and etching, and relates more particularly to an evaporator for a liquid raw material used for this purpose.

In recent years, a large number of liquid raw materials are being used for manufacturing semiconductor integrated circuits, and the number of kinds of these raw materials and the using volume of these raw materials are in the increasing trend in future as well. For example, TEOS (Tetraethylorthosilicate: $Si(OC_2H_5)_4$) is a general liquid raw material which is used for forming an oxide film as an electric insulation layer between elements on a silicon wafer. The TEOS-LPCVD (low pressure chemical vapor deposition) method using this TEOS is one of the methods for forming a silicon oxide film having excellent characteristics.

FIG. 10 shows the conventional vaporizer. In general, a liquid raw material such as TEOS, is contained in a tank 100 which is kept at a high temperature, and is evaporated under a pressure determined by the vapor pressure the material has at that high temperature. A gas generated by evaporating the liquid raw material in this tank is controlled at a predetermined flow rate by a gas mass flow controller (hereinafter to be abbreviated as an MFC) not shown in the drawing, and is supplied into a process chamber.

In the mean time, recently, a tool or an apparatus to be used for the TEOS-LPCVD process is required to have a high flow rate of a raw material gas in order to obtain a sufficient deposition rate in the high-temperature process. The method shown in FIG. 10, however, has the following problems. In order to increase the flow rate of the TEOS, it is necessary to increase the temperature of the liquid and to expand the surface area of the liquid. Further, in order to expand the surface area of the liquid, it is necessary to expand the size of the tank. Nowadays, a semiconductor apparatus manufacturing unit is required to have a compact size in order to reduce the installation space and to make smaller the move range of the operators. Accordingly, a larger apparatus is not desirable.

Further, there is a limitation to the increasing of the evaporation temperature due to the characteristics of the materials for structuring a supply unit such as a pipe for supplying a gas from the tank to the process chamber and the characteristics of the MFC. In order to prevent a recondensation (freezing) of the TEOS, it is necessary to keep the supply unit at a higher temperature than the temperature of the tank, for example 200° C. or above. However, the temperature of using the MFC is usually limited to not higher than 200° C. Therefore, it is difficult to simply increase the evaporation temperature. In order to solve this problem, the use of a liquid mass flow controller instead of a gas mass flow controller is considered. However, even if the flow rate of a liquid is controlled by using the liquid mass flow controller, it is not possible to measure accurately the flow rate of the gas after the evaporation, so that it is difficult to accurately control the film thickness of the oxide film.

As another example of the conventional evaporator different from the one shown in FIG. 10, there is "Evaporation source for materials" as disclosed in "IBM Technical Disclosure Bulletin", vol. 4, No. 12, May 1962. The apparatus described in this literature has a similar problem to that of the apparatus shown in FIG. 10.

BRIEF SUMMARY OF THE INVENTION

It is an object of the present invention to provide an evaporator which can evaporate a liquid raw material such as TEOS at a high flow rate by restricting the rise in temperature to an unnecessarily high level and restricting the increase in the size of the evaporator.

The above-described object of the present invention can be achieved by the following structure.

An evaporator for evaporating a liquid raw material, comprising:

a container; and a partition separating inside the container into first and second spaces adjacent to each other in a horizontal direction, the partition having a plurality of holes continuing to the first and the second spaces, and a liquid raw material contained in the first space being evaporated in the second space from the plurality of holes so as to fill the second space with an evaporated gas; wherein the pressure of the liquid raw material contained in the first space and the pressure of the gas evaporated in the second space are set to be almost equal to each other.

Further, an apparatus for manufacturing semiconductor apparatuses, comprising:

an evaporator for evaporating a liquid raw material, including:

a container; and a partition separating inside the container into first and second spaces adjacent to each other in a horizontal direction, the partition having a plurality of holes communicating to the first and the second spaces, and a liquid raw material contained in the first space being evaporated in the second space from the plurality of holes so as to fill the second space with an evaporated gas; wherein the pressure of the liquid raw material contained in the first space and the pressure of the gas evaporated in the second space are set to be almost equal to each other, a heater for heating the evaporator to a predetermined temperature;

a first supply unit connected to the first space, for supplying the liquid raw material into the first space;

a reactor for accommodating a semiconductor substrate to be processed;

a second supply unit for connecting between the second space and the reactor and for supplying a gas within the second space to the reactor;

a detector provided in the second supply unit, for detecting the pressure of a gas supplied from the second space;

a control section connected to the detector and the supply unit, the control section for controlling a supply quantity of the liquid raw material from the supply unit according to an output signal of the detector; and a mass flow controller provided in the second supply unit, for controlling the flow rate of a gas supplied from the second space.

Further, a method for evaporating a liquid raw material, comprising steps of:

introducing a rare gas into a first space and a second space which are provided adjacent to each other in a horizontal direction by separating inside of a container by a partition having a plurality of holes;

introducing a liquid raw material into the first space, the pressure of the liquid raw material within the first space and the pressure of the rare gas within the second space being set to be almost equal to each other; and exhausting the rare gas from the second space, filling the second space with a gas generated by evaporating the liquid raw material in the first space through the holes, and controlling the flow rate of the gas supplied.

According to the present invention, by increasing the surface area of the partition having the plurality of holes for separating the first and second spaces, the liquid raw material can be evaporated at a high flow rate without increasing the size of the evaporator. Further, when this evaporator is used, the conventional gas MFC can be used for controlling the flow rate of the gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a configuration diagram for showing the apparatus for manufacturing a semiconductor apparatus using the evaporator according to the present invention;

FIGS. 8A to 8D are diagrams for explaining the operation of the apparatus shown in FIG. 7;

DETAILED DESCRIPTION OF THE INVENTION

Embodiments of the present invention will be explained below with reference to the drawings.

Figure 1:
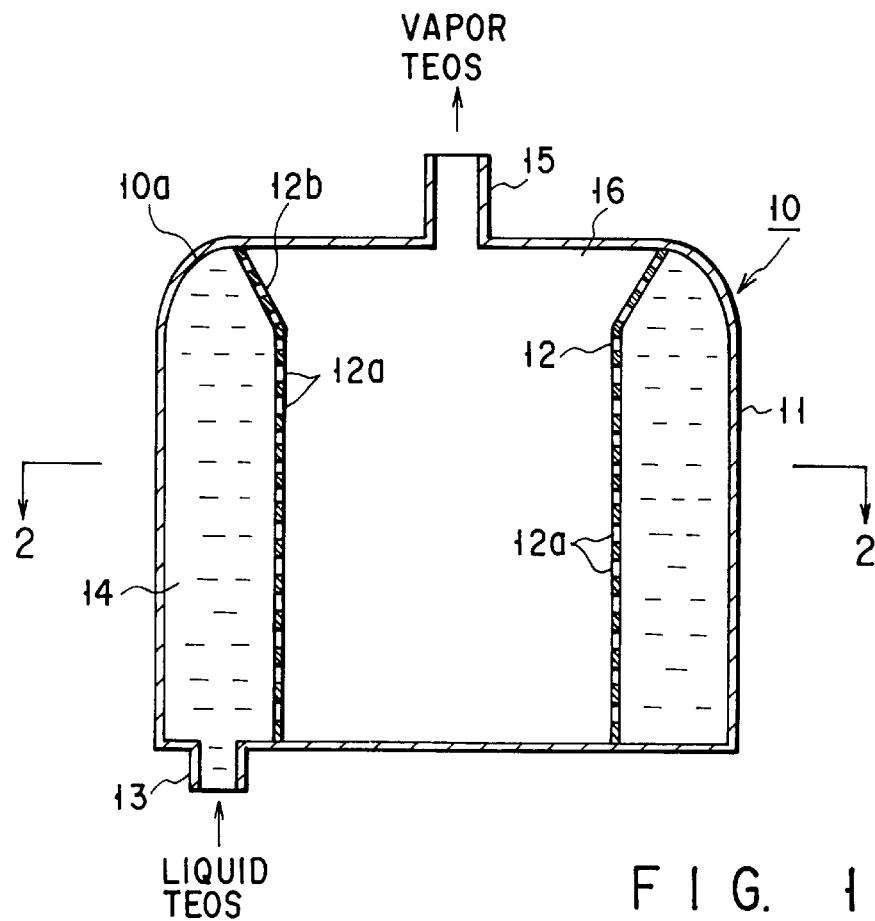
FIG. 1 is a cross sectional diagram for showing a first embodiment of the evaporator according to the present invention.
Figure 2:
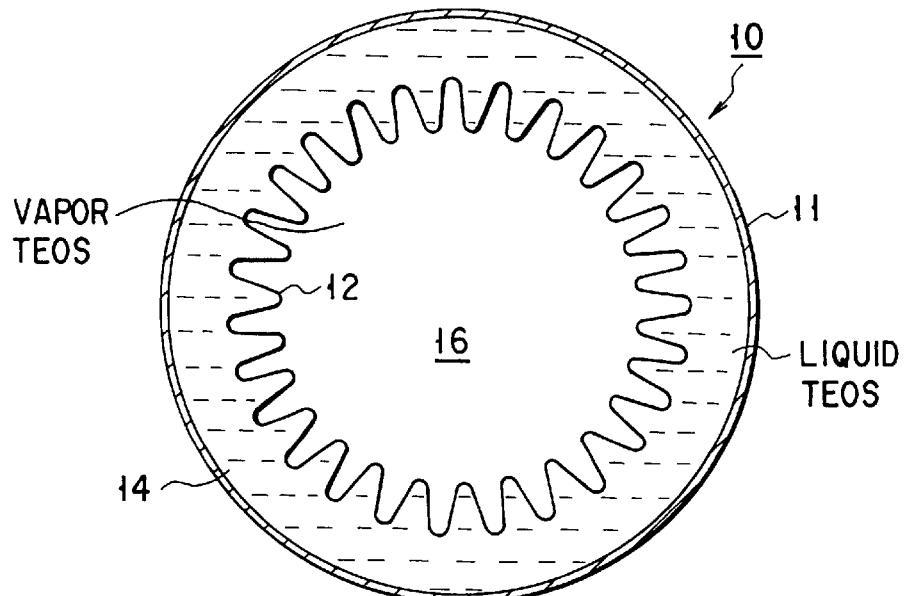
FIG. 2 is a cross sectional diagram cut along the line 2—2 of FIG. 1.

FIGS. 1 and 2 show evaporators relating to a first embodiment of the present invention. In this embodiment, an evaporator 10 has a double wall structure. For example, inside a first cylinder 11 made of stainless steel, a second cylinder made of stainless steel is disposed. The second cylinder 12 has an undulated surface which has a plurality of fine holes 12a. The surface of the second cylinder 12 is undulated in order to have a larger surface area. The bottom surface section of the first cylinder 11 has inlet 13 at a portion of the position between the inner wall of the first cylinder 11 and the outer wall of the second cylinder 12. This inlet 13 communicates to a first space 14 positioned between the inner wall of the first cylinder 11 and the outer wall of the second cylinder 12. An outlet 15 is provided at a position of the upper surface section of the first cylinder 11 and inside the second cylinder 12. This outlet 15 communicates to a second space 16 positioned inside the second cylinder 12. In the case of this embodiment, the whole of the tank 10 is kept at a high temperature within the range of 100° C. to 200° C., for example, and the first space is filled with a liquid phase TEOS. The liquid phase TEOS evaporates from the fine holes 12a of the second cylinder 12 and the second space 16 is filled with a gas phase TEOS.

An upper section 10a of the first cylinder 11 is bent to have a smaller diameter of the cylinder, and an upper section 12b of the second cylinder 12 is sloped to have a larger diameter of the cylinder. This structure is provided in order to securely exclude nitrogen gas introduced within the first space, as described later. The outer shape of the first and second cylinders 11 and 12 is not limited to the shape shown in FIG. 1, and the second cylinder 12 may have any structure when this can have an increased surface area.

Figure 3:
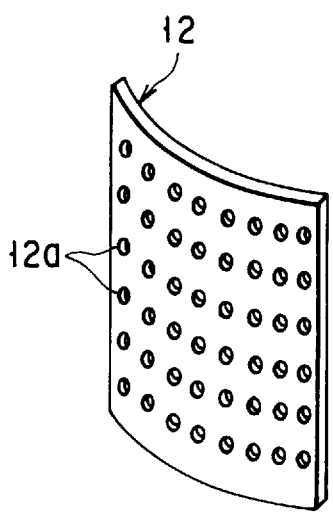
FIG. 3 is a perspective view for showing a part of a second cylinder shown in FIG. 1.
Figure 4:
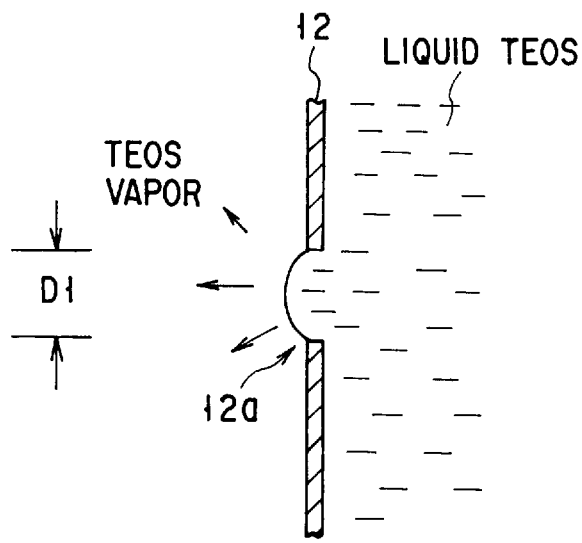
FIG. 4 is a cross sectional diagram for showing a part of the second cylinder shown in FIG. 1.

FIG. 3 shows in enlargement a part of the second cylinder 12, and FIG. 4 shows in enlargement one of the fine holes of the second cylinder 12. Diameter D1 of the fine hole 12a is a few millimeters, for example, and these fine holes are formed with the interval of a few millimeters, for example. The surface of the liquid TEOS in the fine hole 12a has a balanced power among the surface tension of the liquid TEOS, the vapor pressure of the evaporated TEOS and the pressure for pressing the liquid TEOS at the inlet 13. Accordingly, the liquid TEOS can be evaporated without dropping a drip from the fine hole 12a into the second space 16.

Figure 10:
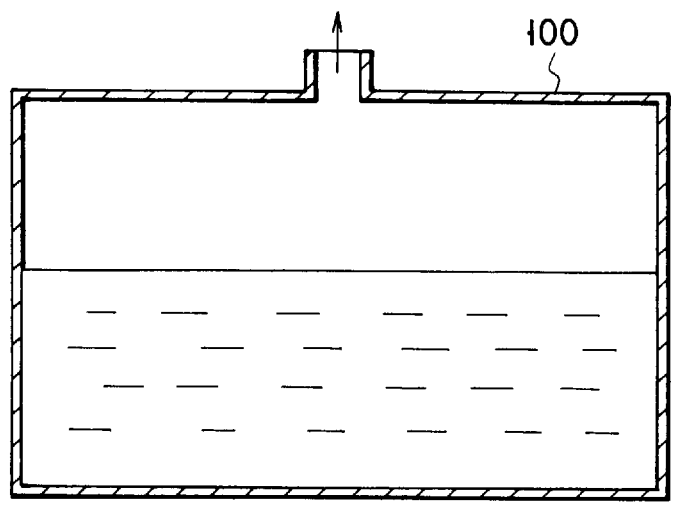
FIG. 10 is a cross sectional diagram for showing the conventional evaporator.

According to the first embodiment, it is possible to increase the surface area of the second cylinder 12 and the surface area of the liquid TEOS, without increasing the size of the first cylinder 11. Accordingly, the vapor liquid interface can be increased, and thus a large quantity of gas TEOS can be obtained by evaporation within the second space 16 inside the second cylinder 12. In other words, when the outer shape of the evaporator is the same as that of the conventional evaporator shown in FIG. 10, while the conventional evaporator can obtain the flow rate of only about 170 to 180 cc, the evaporator according to the present embodiment can obtain the flow rate of as much as one liter.

Further, since the temperature for evaporating the liquid TEOS may be the same as the conventional temperature, a gas MFC can be used. Accordingly, a gas TEOS can be supplied to the reactor by accurately measuring the flow rate of the gas TEOS by the gas MFC, so that the film thickness of the oxide film can be controlled accurately.

Moreover, since the diameter and the height of the first cylinder 11 are approximately 30 cm and approximately 50 cm respectively, the installation space can be reduced to enable the disposition of the evaporator next to the CVD apparatus, for example.

Figure 5:
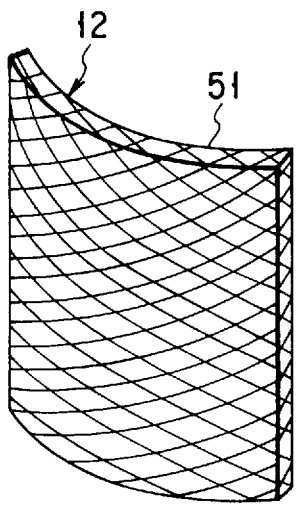
FIG. 5 is a perspective view of a part of the second cylinder for showing a second embodiment of the evaporator according to the present invention.
Figure 6:
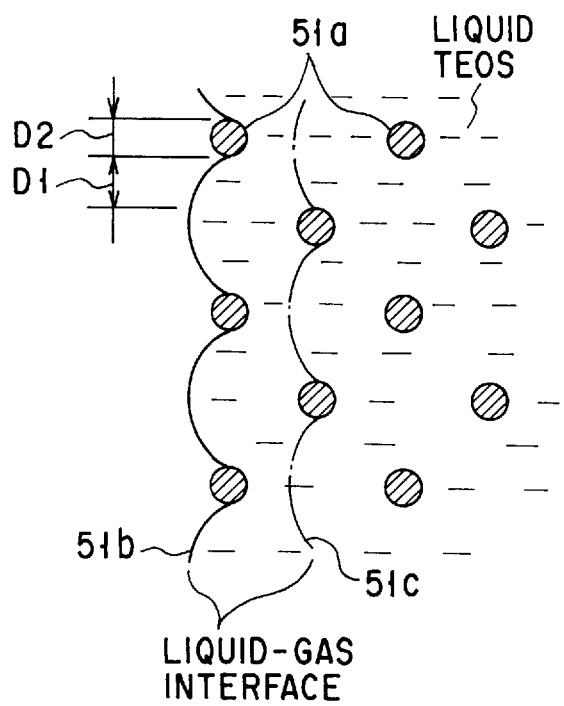
FIG. 6 is a cross sectional view for showing a part of a second cylinder shown in FIG. 5.

FIGS. 5 and 6 show a second embodiment of the present invention. In the case of the present embodiment, the second cylinder 12 is structured by a fine metal mesh 51 having a predetermined thickness. The fine metal mesh 51 is formed by knitting three dimensionally stainless steel fine wires 51*a* having a diameter D2 of not larger than a few dozens of 10 μm, for example. This fine metal mesh 51 has a thickness of several cm, for example, 1 cm, and the wires 51*a* are knitted with a set interval L1 of several dozens of 10 μm, for example. Accordingly, fine holes 51*b* to be formed by these wires 51*a* are in square shape having several dozens of 10 μm for one side. The above-described fine metal mesh 51 has an undulated surface for all the shape, as shown in FIG. 2, for example.

According to the second embodiment, since the second cylinder 12 is structured by the fine metal mesh 51, a large number of fine holes 51*b* can be formed easily, so that the vapor liquid interface can be expanded easily. As a result, a larger quantity of gas than that of the first embodiment can be generated.

Further, since the fine metal mesh 51 is a three-dimensional mesh, the vapor liquid interface can change within the range of the thickness of the fine metal mesh 51 when the pressure of the gas TEOS or the pressure of the liquid TEOS of the second cylinder 12 has changed. In other words, the vapor liquid interface changes according to the pressure as shown by a solid line 51*b* and a broken line 51*c* in FIG. 6. Therefore, the pressure control of the gas TEOS and liquid TEOS becomes easy, and a drop of the liquid TEOS within the second space 16 of the second cylinder 12 can be prevented.

FIG. 7 shows a structure of the apparatus for manufacturing a semiconductor apparatus using the evaporator of the present invention. In FIG. 7, portions which are the same as those in FIG. 1 are referenced with the same symbols.

A heater 71 for heating the whole of the evaporator 10 is provided around the evaporator 10. At the inlet 13 of the evaporator 10, a first container 73 is connected through a pipe 72, and at the same time, a second container 75 is connected through a pipe 74. A valve 76 is provided in the pipe 72 and a valve 77 is provided in the pipe 74. A rare gas such as a nitrogen gas is contained in the first container 73, and a liquid TEOS is contained in the second container 75. A pipe 78 is connected to the second container 75, and a valve 79 is provided in the pipe 78. The pipe 78 introduces a nitrogen gas, for example, into the second container 75. The liquid TEOS within the second container 75 is sent out by the pressure of the nitrogen gas.

On the other hand, a pipe 80 is connected to the outlet 15 of the evaporator 10, and the evaporator 10 is connected to a reactor 85 by the pipe 80. A valve 81, a pressure sensor (PS) 82, a known gas mass flow controller (MFC) 83 and a valve 84 are sequentially provided to the pipe 80. The pressure sensor 82 detects a pressure of the gas TEOS within the evaporator 10 and supplies a detection signal to a control section 86. The control section 86 controls the valve 79 according to the detection signal of the pressure sensor 82 and controls the supply quantity of the liquid TEOS.

A plurality of wafers to be processed are contained within the reactor 85, and a heater 87 for heating the reactor 85 is provided around the reactor 85. An exhaust pipe 88 is connected to the reactor 85, and a pump 89 is provided in the pipe 88. One end of a pipe 90 is connected between the gas mass flow controller 83 of the pipe 80 and the valve 84. The other end of the pipe 90 is connected to the pipe 88 positioned between the pump 89 and the reactor 85.

The valves 76, 77, 81, 84 and 91 are open and close controlled by the control section 86.

FIGS. 8A to 8D show the operation of the evaporator shown in FIG. 7. At first, as shown in FIG. 8A, the valves 77, 81, 84 and 91 are closed and the valve 76 is opened to introduce a nitrogen gas into the evaporator 10 so as to fill the whole inside of the evaporator 10 with the nitrogen gas $N_2$. The pressure of this nitrogen gas is set very close to the pressure of the gas TEOS. In this state, as shown in FIG. 8B, the valve 76 is closed and the valve 77 is opened so that the liquid TEOS is introduced slowly into the first space 14. In this case, the evaporator 10 is heated by the heater to a temperature at which the liquid TEOS is not boiled suddenly.

As shown in FIG. 8C, in the state that the liquid TEOS is filled within the first space 14, the valve 81 and the valve 91 provided in the pipe 90 as the vent line are opened to exhaust the nitrogen gas, and the gas flow rate is controlled by the MFC 83. Then, the liquid TEOS within the first space 14 is evaporated within the second space 16 through the fine holes 12*a*, so that the second space 16 is filled with the gas TEOS. This gas TEOS is sent out from the outlet. After the flow rate of the gas TEOS is stabilized by the MFC 83, as shown in FIG. 8D, the valve 91 is closed and the valve 84 is opened, so that the gas TEOS is introduced into the reactor. Thereafter, the semiconductors are processed within the reactor.

In the first and second embodiments, the liquid TEOS is filled in the first space 14 of the evaporator 10 and the evaporated gas TEOS is contained in the second space 16. However, the structure is not limited to the above-described structure.

Figure 9:
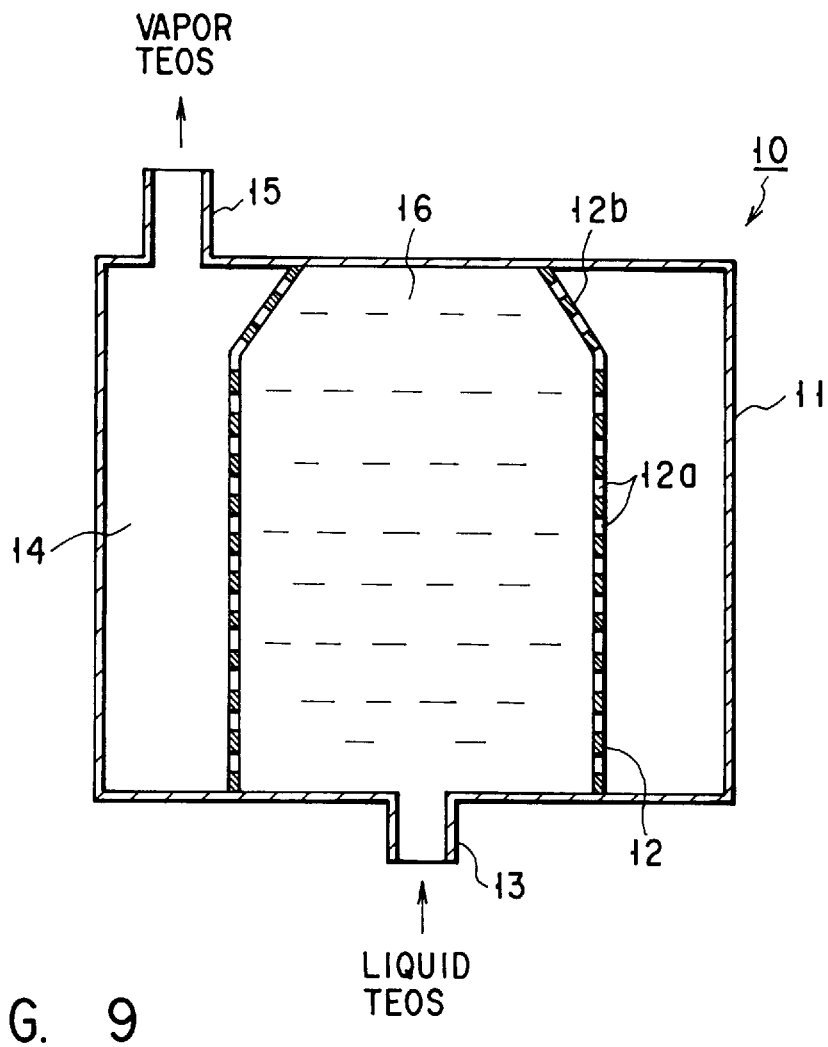
FIG. 9 is a cross sectional diagram for showing a third embodiment of the evaporator according to the present invention.

FIG. 9 shows a third embodiment of the present invention. In this embodiment, the inlet 13 is provided in the second space 16 of the evaporator 10, and the outlet 15 is provided in the first space 14. Accordingly, the liquid TEOS is filled in the second space 16 and the evaporated gas TEOS is contained in the first space 14. By this embodiment, a similar effect to that of the first and second embodiments can be obtained.

Further, in the above description, the evaporation of the liquid TEOS is explained. As a liquid material, the material is not limited to TEOS, but it is also possible to use a pure water to be used for an oxidization and an etching, TMP as a source of phosphorus, TEB and TMB as sources of boron, TEOA as a source of arsenic, for example.

Further, the material for structuring the second cylinder is not limited to the first to the third embodiments, but it is also possible to use a porous material which is suitable for the characteristics of the liquid material to be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An evaporator for evaporating a liquid raw material, comprising:
   a container;
   a partition separating an interior of said container into first and second spaces which are arranged in a horizontal direction, said partition having a plurality of holes communicating to said first and said second spaces, and a liquid raw material contained in said first space being evaporated in said second space from said plurality of holes so as to fill said second space with an evaporated gas; and a controller for controlling the pressure of said liquid raw material contained in said first space and the pressure of said gas evaporated in said second space to be almost equal to each other.

2. An evaporator according to claim 1, wherein said partition has an undulated surface.

3. An evaporator according to claim 2, wherein said partition comprises a metal plate.

4. An evaporator according to claim 2, wherein said partition comprises a metal mesh.

5. An evaporator according to claim 2, wherein said partition comprises a porous material.

6. An evaporator according to claim 1, wherein said liquid raw material is one of TEOS, pure water, TMP, TEB, TMB and TEOA.

7. An evaporator for evaporating a liquid raw material, comprising:

a first container;

a second container provided inside said first container, for separating inside of said first container into first and second spaces, said second container having a plurality of holes communicating to said first and second spaces, said first space being positioned between an inner wall of said first container and an outer wall of said second container, and said second space being positioned inside said second container;

an inlet communicating to said first space, for introducing a liquid raw material into said first space;

an outlet communicating to said second space, for sending out a gas generated within said second space by evaporating a liquid raw material contained within said first space through said plurality of holes; and a controller for controlling the pressure of said liquid raw material contained in said first space and the pressure of said gas evaporated in said second space to be almost equal to each other.

8. An evaporator according to claim 7, wherein said second container has an undulated surface.

9. An evaporator according to claim 8, wherein said second container comprises a metal plate.

10. An evaporator according to claim 8, wherein said second container comprises a metal mesh.

11. An evaporator according to claim 8, wherein said second container comprises a porous material.

12. An evaporator according to claim 7, wherein said liquid raw material is one of TEOS, pure water, TMP, TEB, TMB and TEOA.

13. An evaporator for evaporating a liquid raw material, comprising:

a first container;

a second container provided inside said first container, for separating inside of said first container into first and second spaces, said second container having a plurality of holes communicating through said first and second spaces, said first space being positioned between an inner wall of said first container and an outer wall of said second container, and said second space being positioned inside said second container;

an inlet communicating to said second space, for introducing a liquid raw material into said second space;

an outlet communicating to said first space, for sending out a gas generated within said second space by evaporating a liquid raw material contained within said first space through said plurality of holes; and a controller for controlling the pressure of said liquid raw material contained in said first space and the pressure of said gas evaporated in said second space to be almost equal to each other.

14. An evaporator according to claim 13, wherein said second container has an undulated surface.

15. An evaporator according to claim 14, wherein said second container comprises a metal plate.

16. An evaporator according to claim 14, wherein said second container comprises a metal mesh.

17. An evaporator according to claim 13, wherein said second container comprises a porous material.

18. An apparatus for manufacturing semiconductor apparatuses, comprising:

an evaporator for evaporating a liquid raw material, including:

a container; and a partition for separating inside said container into first and second spaces adjacent to each other in a horizontal direction, said partition having a plurality of holes communicating to said first and said second spaces, and a liquid raw material contained in said first space being evaporated in said second space from said plurality of holes so as to fill said second space with an evaporated gas; wherein the pressure of said liquid raw material contained in said first space and the pressure of said gas evaporated in said second space are set to be almost equal to each other, a heater for heating said evaporator to a predetermined temperature;

a first supply unit connected to said first space, for supplying said liquid raw material into said first space;

a reactor for accommodating a semiconductor substrate to be processed;

a second supply unit for connected between said second space and said reactor and for supplying a gas within said second space to said reactor;

a detector provided in said second supply unit, for detecting the pressure of a gas supplied from said second space;

a control section connected to said detector and said supply unit, said control section for controlling a supply quantity of said liquid raw material from said supply unit according to an output signal of said detector; and a mass flow controller provided in said second supply unit, for controlling the flow rate of a gas supplied from said second space.

19. An evaporator according to claim 18, wherein said partition has an undulated surface.

20. An evaporator according to claim 19, wherein said partition comprises a metal plate.

21. An evaporator according to claim 19, wherein said partition comprises a metal mesh.

22. An evaporator according to claim 19, wherein said partition comprises a porous material.

23. An evaporator according to claim 18, wherein said liquid raw material is one of TEOS, pure water, TMP, TEB, TMB and TEOA.

24. A method for evaporating a liquid raw material, comprising steps of:

introducing a rare gas into a first space and a second space which are provided adjacent to each other in a horizontal direction by separating inside of a container by a partition having a plurality of holes;

introducing a liquid raw material into said first space, the pressure of said liquid raw material within said first space and the pressure of said rare gas within said second space being set to be almost equal to each other; and exhausting said rare gas from said second space, filling said second space with a gas generated by evaporating said liquid raw material in said first space through said holes, and controlling the flow rate of said gas supplied.

25. A method for fabricating a semiconductor device, comprising steps of:

introducing a rare gas into a first space and a second space which are provided adjacent to each other in a horizontal direction by separating inside of a container by a partition having a plurality of holes;

introducing a liquid raw material into said first space, the pressure of said liquid raw material within said first space and the pressure of said rare gas within said second space being set to be almost equal to each other;

exhausting said rare gas from said second space, filling said second space with a gas generated by evaporating said liquid raw material in said first space through said holes, and controlling the flow rate of said gas supplied; and introducing said gas whose flow rate is controlled into a reactor containing a target wafer.

26. An evaporator for evaporating a liquid raw material used in a manufacturing apparatus of a semiconductor device, comprising:

a container;

a partition for separating an interior of said container into first and second spaces which are arranged in a horizontal direction, said partition having a plurality of holes communicating to said first and said second spaces, and a liquid raw material contained in said first space being evaporated into said second space from said plurality of holes; and a controller for controlling an amount of said liquid raw material contained in said first space in accordance with a pressure of a gas evaporated into said second space.

27. An evaporator for evaporating a liquid raw material used in a manufacturing apparatus of a semiconductor device, comprising:

a container having a first portion and second portions, said first portion being supplied with a liquid raw material;

a separator arranged in said container for separating said first and second portions, said separator having a plurality of holes communicating to said first and second portions, said liquid raw material supplied to said first portion being evaporated into said second portion through the holes; and a controller for controlling an amount of said liquid raw material supplied to said first portion in accordance with a pressure of a gas evaporated in said second portion.

28. An evaporator for evaporating a liquid raw material, comprising:

a container; and a partition separating an interior of said container into first and second spaces, said partition having a plurality of holes communicating to said first and second spaces, and a liquid raw material contained in said first space being evaporated into said second space through said plurality of holes, wherein said partition has an undulated surface.

* * * * *